(12) United States Patent
Kreindl

(10) Patent No.: US 10,493,747 B2
(45) Date of Patent: *Dec. 3, 2019

(54) METHOD AND DEVICE FOR EMBOSSING OF A NANOSTRUCTURE

(71) Applicant: EV GROUP E. THALLNER GMBH, St. Florian am Inn (AT)

(72) Inventor: Gerald Kreindl, Scharding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/141,059

(22) Filed: Sep. 25, 2018

(65) Prior Publication Data

US 2019/0022999 A1 Jan. 24, 2019

Related U.S. Application Data

(63) Continuation of application No. 15/113,111, filed as application No. PCT/EP2014/058141 on Apr. 22, 2014, now Pat. No. 10,118,381.

(51) Int. Cl.
*B41F 19/02* (2006.01)
*G03F 7/20* (2006.01)
*G03F 7/00* (2006.01)

(52) U.S. Cl.
CPC ............ *B41F 19/02* (2013.01); *G03F 7/0002* (2013.01); *G03F 7/70733* (2013.01); *G03F 7/70783* (2013.01)

(58) Field of Classification Search
None
See application file for complete search history.

(56) References Cited

U.S. PATENT DOCUMENTS 6,180,288 B1 * 1/2001 Everhart .......... G01N 33/54373
264/1.1
6,943,117 B2 9/2005 Jeong et al.
(Continued)

FOREIGN PATENT DOCUMENTS

AT 405775 B 11/1999
DE 10 2004 007 060 B3 7/2005
(Continued)

OTHER PUBLICATIONS

International Search Report from corresponding International Patent Application No. PCT/EP2014/058141, dated Jan. 23, 2015.
(Continued)

*Primary Examiner* — Justin N Olamit
(74) *Attorney, Agent, or Firm* — Kusner & Jaffe

(57) ABSTRACT

A method for embossing a nanostructure, formed on a nanostructure punch, into a punch surface of a curable material which has been applied to a substrate. The method includes the following steps, especially following sequence: alignment of the nanostructure relative to the punch surface, embossing of the punch surface by a) prestressing of the nanostructure punch by deformation of the nanostructure punch and/or prestressing of the substrate by deformation of the substrate, b) making contact of a partial area of the punch surface with the nanostructure punch and c) automatic contacting of the remaining surface at least partially, especially predominantly, by the prestressing of the nanostructure punch and/or the prestressing of the substrate.

20 Claims, 8 Drawing Sheets

(56) References Cited

U.S. PATENT DOCUMENTS

| | | | |
|---|---|---|---|
| 8,678,808 B2 | 3/2014 | Yoshida et al. | |
| 8,764,431 B2 * | 7/2014 | Yamashita | B82Y 10/00 |
| | | | 264/293 |
| 9,613,840 B2 * | 4/2017 | Wagenleitner | H01L 21/67092 |
| 2006/0130678 A1 | 6/2006 | Sewell | |
| 2008/0229948 A1 | 9/2008 | Washiya et al. | |
| 2010/0072652 A1 | 3/2010 | GanapathiSubramanian et al. | |
| 2010/0270264 A1 | 10/2010 | Ito et al. | |
| 2010/0297282 A1 | 11/2010 | De Schiffart et al. | |
| 2011/0217479 A1 | 9/2011 | Yamashita et al. | |
| 2012/0086149 A1 | 4/2012 | Yoshida et al. | |
| 2013/0105853 A1 * | 5/2013 | Kneissl | H01L 33/32 |
| | | | 257/99 |
| 2014/0182761 A1 * | 7/2014 | Hayashi | H01L 21/67092 |
| | | | 156/60 |

FOREIGN PATENT DOCUMENTS

| | | |
|---|---|---|
| EP | 2 261 966 B1 | 3/2012 |
| JP | 2011-211157 A | 10/2011 |
| JP | 2012-099790 A | 5/2012 |
| JP | 2014-027075 A | 2/2014 |
| TW | 200804053 A | 1/2008 |
| WO | WO-2006/117745 A2 | 11/2006 |
| WO | WO-2007/136832 A2 | 11/2007 |
| WO | WO-2012/028166 A1 | 3/2012 |
| WO | WO-2012/133840 A1 | 10/2012 |
| WO | WO-2013/023708 A1 | 2/2013 |
| WO | WO-2013/118546 A1 | 8/2013 |

OTHER PUBLICATIONS

Office Action issued in corresponding U.S. Appl. No. 15/113,111 dated May 8, 2017.

Office Action issued in corresponding U.S. Appl. No. 15/113,111 dated Oct. 26, 2017.

Office Action issued in corresponding U.S. Appl. No. 15/113,111 dated Mar. 22, 2018.

* cited by examiner

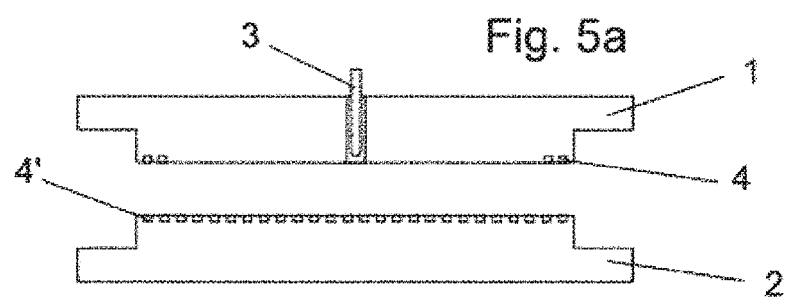
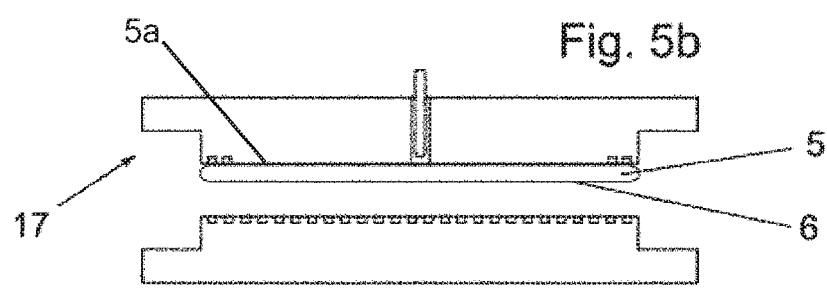
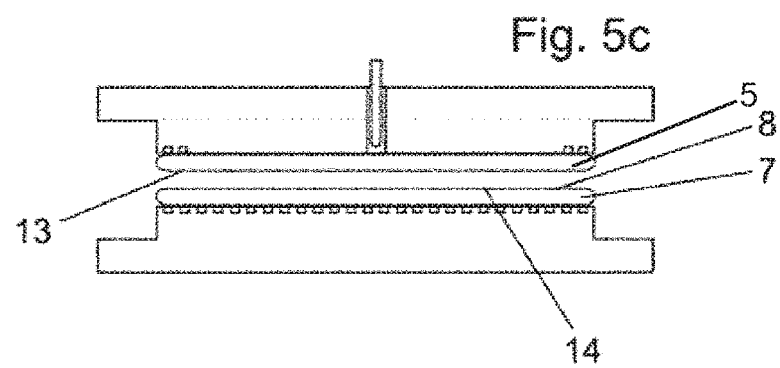

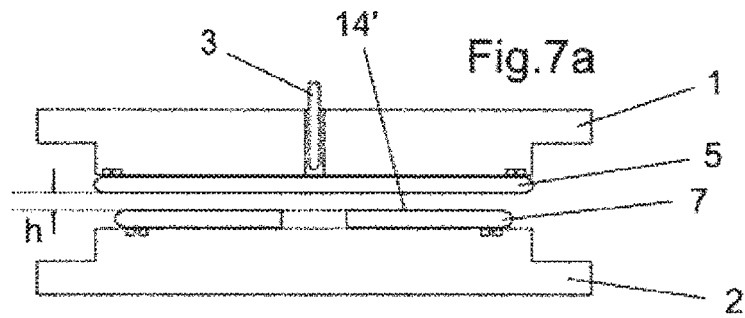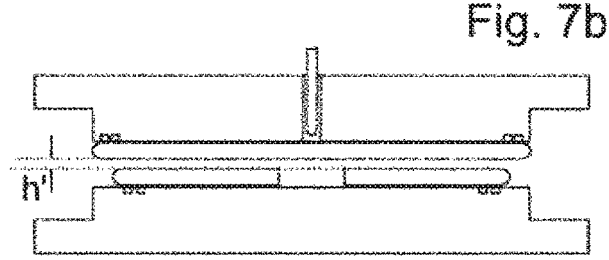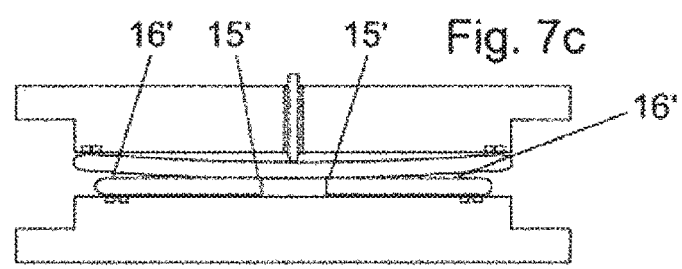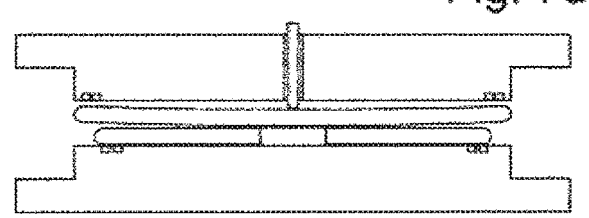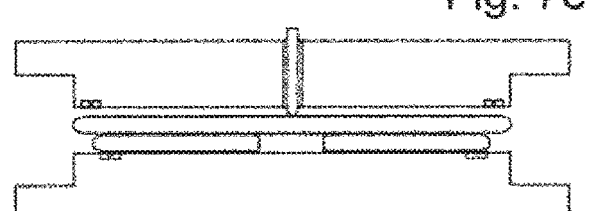

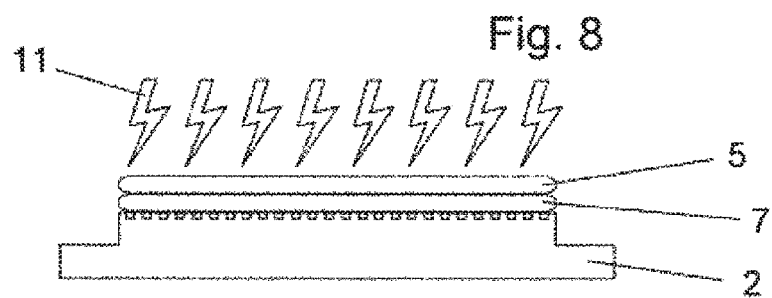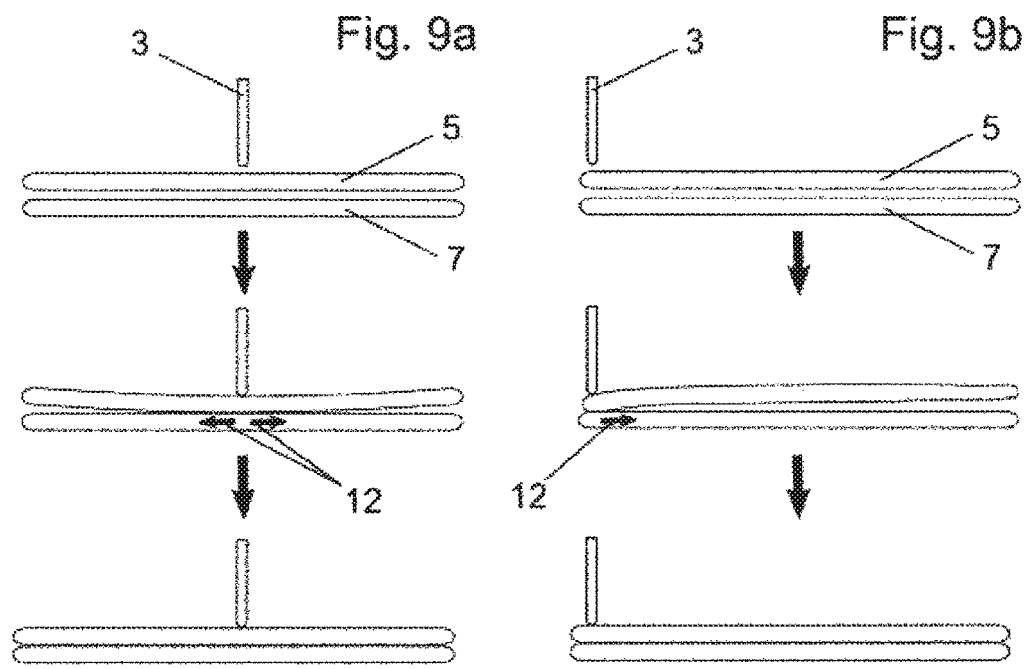

METHOD AND DEVICE FOR EMBOSSING OF A NANOSTRUCTURE

RELATED APPLICATIONS

This application is a continuation of U.S. application Ser. No. 15/113,111, filed Jul. 21, 2016 (now U.S. Pat. No. 10,118,381, issued Nov. 6, 2018), which is a U.S. National Stage of International Application No. PCT/EP2014/58141, filed Apr. 22, 2014, said patent applications herein fully incorporated by reference.

FIELD OF THE INVENTION

This invention relates to a method of embossing a nanostructure and to a corresponding device for embossing a nanostructure.

BACKGROUND OF THE INVENTION

Nanoimprint lithography (NIL) is a forming method in which nanostructures are formed by a punch in curable materials, for example resist. In doing so not only is forming of a large number of nanostructure systems possible, but also the production of high-precision nanostructures on large areas by a step-and-repeat or a roll method. High-resolution surface structuring can be carried out with it. Fundamentally it is distinguished between thermal NIL (hot-embossing NIL) and UV-based NIL methods.

Based on the viscosity of the photoresist, capillary action can completely fill the intermediate spaces of the punch with it. In UV-NIL the punch at room temperature is pressed into the flowable resist, while in thermal NIL methods the thermoplastic resist must be pressed into the resist at elevated temperature (above the glass transition temperature). The punch is removed only after the cooling. In UV-NIL lower contact pressures can be used and the process can take place at room temperature. The UV resist crosslinks when exposed to UV radiation into a stable polymer (curing). Therefore structuring can be carried out with "soft" polymer punches and with hard punches. The soft UV-NIL with polymers as the punch materials, depending on the application, is an often economical alternative to structuring with hard punches. Soft UV-NIL (therefore with polymer punches) is also carried out with hard polymer punches. The modulus of elasticity of quartz is roughly 100 GPa. In comparison, the moduli of elasticity of polymers (hard and soft polymers) are up to several orders of magnitude smaller, therefore they are called "soft" compared to quartz (soft lithography).

The most important parameters in the NIL methods are the temperature (mainly in hot-embossing NIL), the contact pressure and the adhesion between the resist and punch. In order to reduce high adhesion between the resist and punch, the punch surface should have a surface energy as low as possible—in interplay with the resist.

Depending on the application, the 3-D structured resist itself can be used as a functional unit or is used as a mask for following etching steps.

For large areas it is difficult to distribute the pressure uniformly over the entire contact surface and to compensate for irregularities. Therefore nonuniform structuring can occur. In order to carry out the structuring of larger areas, embossing is done with a roller or alternatively the entire surface is gradually structured with a smaller punch by shifting the punch (step-and-repeat method).

Nanoimprint is used to produce multilayer structures and (economical) nanostructures (for example integrated circuits in silicon technology) with a resolution below the diffraction limit of light. A large-area nano-embossing process on the entire wafer allows costs, effort and time consumption to be kept low.

Embossing defects which can occur in NIL are for example cracks, nonuniformly filled punch structures (therefore for example air inclusions) and a nonuniform resist layer thickness. The adhesion between the resist and punch is critical. Otherwise distortions or cracks occur. Soft and also hard punches can deform by the applied pressure during the NIL process. Furthermore (dirt) particles are very critical. Particles which are located between for example the resist and punch lead to defects in the entire periphery of the particle.

High-resolution structuring in the low nm range ($\leq 50$ nm) is one of the most important advantages of NIL. The replication of structures in the sub 20 nm range is however still a challenge.

Often, for larger wafers, several embossing steps in succession must be carried out to achieve the desired dimensional accuracy. The problem with these embodiments is however ensuring an exact alignment of the many embossing steps with the punch. Generally alignment marks which are located on the substrate and/or on the punch are used. High-precision, aligned embossing of different layers on top of one another is not possible or is possible only with great effort.

SUMMARY OF THE INVENTION

The object of this invention is to devise a method and a device for embossing of a nanostructure with which large-area substrates can be embossed as much as possible without repeating process steps with structures which are as small as possible.

This object is achieved with the features of the independent claim(s). Advantageous developments of the invention are given in the dependent claims. All combinations of at least two of the features given in the specification, the claims and/or the figures also fall within the scope of the invention. At the given value ranges, values which lie within the indicated limits will also be considered to be disclosed as boundary values and will be claimed in any combination. To the extent features disclosed for the device can also be interpreted as features of the method, they should also be considered as according to the method and vice versa.

The basic idea of this invention is to make contact first with only a partial area of a punch surface with the nanostructure punch by prestressing a nanostructure punch and/or a substrate and then to effect automatic contact-making with the contact surface by releasing the nanostructure punch, preferably the entire punch area being embossed without repeating the aforementioned steps.

The invention relates in particular to an installation and a method for carrying out a large-area UV-NIL nanoembossing process with a hard nanostructure punch.

The invention relates in particular to equipment and a method for carrying out a large-area nanoembossing process. The large-area nanoimprint process (up to 18" substrates or more) is carried out with a hard UV-transparent nanostructure punch—typically in wafer format. In doing so the structured nanostructure punch makes contact with a substrate to which resist has been applied beforehand over the entire surface. The resist can be applied separately from the embossing process in its own module. The imprint takes place especially under a vacuum or at ambient pressure in an inert gas atmosphere. The embossing front can alternately be started with an actuator in the center or substrate edge. The structured punch surface can be impressed in the curable material, especially resist, on the substrate and the structures of the nanostructure punch can be replicated by the propagation of the embossing front. The process can preferably be used for embossing a first layer or a second layer in combination with exact alignment (SmartView Alignment).

The invention can be used in combination with the established industrial resist application methods, such as for example spin coating methods. The resist can be applied separately from the embossing process in its own module. Thus the application of the resist to the substrate is fast, free of defects, blanketing, free of particles and standardized; this also entails throughput advantages in the embossing step. Embossing in the vacuum or at ambient pressure under inert gas is possible for reduced embossing defects (for example air inclusions, etc.) and easier separation between nanostructure punch and substrate. One important advantage of this new technology is that substrates to which resist has been applied in a blanket manner can also be contacted at ambient pressure without defects.

Other advantages include the following:
no distortion,
replication of structures in the sub 10 nm range,
combination with alignment for high-precision, aligned embossing of different layers on top of one another, for example with the aid of the SVA (SmartView® Alignment) method, and
higher resolution is possible.

The invention relates in particular to a method and a device for transfer of a structure, in particular a microstructure or more preferably a nanostructure from a UV-transparent nanostructure punch to one flat side of a resist-blanketed substrate with a substrate pallet which holds the substrate on a substrate chucking surface, a structure surface of the nanostructure punch which can be aligned parallel to the substrate chucking surface and which can be arranged opposite it, and with an actuator which acts orthogonally to the substrate chucking surface and to the structure surface of the nanostructure punch.

The invention is based on a large-area nanoimprint process by means of a hard UV-transparent punch. The nanostructure punch can also be transparent to other ranges of electromagnetic radiation. A wafer is defined as a substrate or product substrate, for example a semiconductor wafer. Substrates with a hole such as HDDs are also intended. The product substrates can also be bilaterally structured or processed product substrates. The substrate can have any shape, preferably round, rectangular or square, more preferably in the wafer format. The diameter of the substrates is more than 2 inches, preferably more than 4 inches, more preferably more than 6 inches, still more preferably more than 8 inches, most preferably more than 12 inches, most preferably of all more than 18 inches. Square glass substrates have dimensions of 5 mm×5 mm to 20 mm×20 mm or larger. Rectangular glass substrates have dimensions of 5 mm×7 mm to 25 mm×75 mm or larger. The nanostructure punch can have any shape, preferably round, rectangular or square, more preferably the wafer format. The diameter of the nano structure punch preferably largely agrees with the diameter of the substrates.

The nanostructure punches are preferably formed from hard UV-transparent materials such as quartz/silicon dioxide, more preferably they are UV-transparent polymer punches such as among other polydimethylsiloxane, poly- tetrafluorethylene, perfluorinated polyether, polyvinyl alcohol, polyvinyl chloride, ethylene tetrafluorethylene, most preferably they are hard UV-transparent polymers. The punch material of the present invention in UV curing of the embossing material on the substrate is preferably at least partially transparent to the wavelength range of the electromagnetic radiation which cross-links the embossing material. The optical transparency is especially greater than 0%, preferably greater than 20%, more preferably greater than 50%, most preferably greater than 80%, most preferably of all greater than 95%. The wavelength range for the optical transparency is especially between 100 nm and 1000 nm, preferably between 150 nm and 500 nm, more preferably between 200 nm and 450 nm, most preferably between 250 nm and 450 nm.

The UV-transparent and/or IR-transparent nanostructure punch can have any shape, preferably round, rectangular or square, more preferably a wafer format. The diameter of the nanostructure punch preferably essentially agrees with the diameter of the substrates. The nanostructure punch can have a positive and/or negative profiling located on the side facing the substrate surface which is to be treated.

The deposition/contacting of the substrate and the nanostructure punch is especially critical since faults can occur here, and the faults can add up and thus reproducible alignment accuracy cannot be maintained. This leads to considerable scrap. In the critical step of contact-making of the aligned contact surfaces of the substrate and the nanostructure punch more and more exact alignment accuracy or offset of less than 100 µm, especially less than 10 µm, preferably less than 1 µm, most preferably less than 100 nm, most preferably of all less than 10 nm is desirable. At these alignment accuracies many influencing factors must be considered.

The device of this invention can be regarded as a development of the devices which were mentioned the first time in patent AT405775B. AT405775B describes a method and a device for aligned joining of wafer-shaped semiconductor substrate. In the new device of the present invention the substrate and nanostructure punch are joined aligned so that approach and alignment for a nanoimprint embossing process with a hard punch are carried out in a controlled manner. The installation preferably has a system for contactless wedge fault compensation between the punch and substrate which are aligned parallel (see WO2012/028166A1).

The invention is based especially on the idea of the substrate and nanostructure punch making contact in a manner as coordinated and simultaneous as possible, more or less automatically, by at least one of the two, preferably the nanostructure punch, being exposed, before making contact, to prestressing which runs especially concentrically to the middle M of one contact surface of the nanostructure punch radially to the outside and then only the start of making contact being influenced, while after making contact with one section, especially the middle M of the punch, the nanostructure punch is released and automatically embosses the opposite substrate in a controlled manner based on its prestress. The prestress is achieved by a deformation of the nanostructure punch by deformation means, the deformation means in particular based on their shape acting on the side facing away from the embossing side and the deformation being controllable accordingly by the use of different, interchangeable deformation means according to application WO2013/023708A1. Control takes place by the pressure or the force with which the deformation means are acting on the nanostructure punch.

The device can advantageously also be operated in a vacuum or even at ambient pressure under inert gas, as a result of which advantageously embossing defects such as for example air inclusions are avoided. If the device is operated in a vacuum, the pressure is less than 500 mbar, preferably less than 100 mbar, most preferably less than 10 mbar, most preferably of all less than 1 mbar.

A preferably present gas atmosphere can dampen the contact-making process and thus prevent the contact surfaces from coming into contact prematurely or at different sites at the same time, which would lead to distortions. On the other hand gas inclusions can occur. Therefore it is necessary and feasible to optimize the process and in particular match the ambient pressure during contact-making to the circumstances of the substrates and nanostructure punch.

One very frequently used type of fixing of the substrate and nanostructure punch on the respective wafer chuck takes place using a vacuum or negative pressure. The substrate and nanostructure punch are fixed on a flat hardened surface in which vacuum tracks are milled, by negative pressure or vacuum. The wafer chuck (substrate chucking apparatus) for the substrate has vacuum tracks on the entire surface or on the outer zones of the surface. Advantageously the negative pressure channel runs concentrically, in particular circularly, to a center Z of the chucking apparatus, in particular around the entire periphery. This yields uniform fixing. Furthermore, if necessary the contour of the chucking surface can be set back relative to the chucking plane of the chucking surface so that depressions are formed which diminish or change the support surface. Thus bilaterally structured or processed substrates (product substrates) can also be used.

The wafer chuck for the nanostructure punch has in particular a hole for the actuator and vacuum tracks in the edge region. Here there is at least one negative pressure channel which interrupts the chucking surface in the outer ring section of the chucking contour. As necessary, the chucking surface of the chucking apparatus can be reduced so that a smaller contact surface between the substrate and wafer chuck arises.

Other possibilities of fixing of the substrate and nanostructure punch on the respective wafer chuck are mechanical fixing by clamping or electrostatic fixing. Wafer chucks with pins (pin chucks) are used. Special adhesives can also be used.

One embodiment of the substrate chucking apparatus of the present invention moreover enables the handling of substrates, especially wafers, with a liquid layer on top. The liquid layer is especially a liquid embossing resist which is located in the interface during contact-making.

The resist can be applied in particular separately from the embossing process in its own module. Thus standardized resist application methods can be used under controlled conditions; this entails throughput advantages in the subsequent embossing step. The substrate is blanketed beforehand with a nanoimprint resist in a resist application chamber. The layers are applied especially with spin, spray or inkjet methods and immersion coating or roller coating methods. Alternately the solvent is then vaporized and the wafer is transferred to an embossing chamber.

Materials for the substrate surface or substrate coating which is to be embossed can be especially UV-hardenable substances or thermally hardenable substances such as polymers or resists. In UV nanoimprint lithography the nanostructure punch at room temperature is pressed into the flowable resist while in thermal methods the thermoplastic resist is pressed into the resist at elevated temperature. Curing takes place depending on the resist material preferably by UV light but also possibly by IR light. More generally the curing can be carried out by electromagnetic radiation, by heat, by current, by magnetic fields or other methods. The curing is preferably based on polymerization of the base material. In doing so the polymerization is started by a so-called initiator.

An additional antiadhesion coating or the application of an adhesive or the application of a separating agent on the nanostructure punch are provided according to one advantageous embodiment. The nanostructure punch is coated with an antiadhesion layer in order to additionally reduce the adhesion between the nanostructure punch and substrate coating (embossing mass). Preferably the antiadhesion layer is organic molecules with correspondingly low adhesion properties to the substrate coating. The layer thickness of the coating is especially less than 1 mm, preferably less than 100 µm, more preferably less than 10 µm, most preferably less than 1 µm, most preferably of all less than 100 nm, even more preferably less than 10 nm. A small layer thickness has a beneficial effect on the transmission of the electromagnetic radiation which is used for example for UV curing. Separation agents are for example self-organized monolayers (SAM) or multilayers. Surface activation by means of plasma would be conceivable as a further pretreatment step.

By integration of a lamp housing in one embodiment of the device of the present invention, exposure is carried out with UV light, especially through the nanostructure punch, in order to enable curing of the embossing resist with UV light. The nanostructure punch and optionally also other bordering components of the punch mount are made of UV- and/or IR-transparent materials.

The substrate and the nanostructure punch are kept separate during the evacuation and/or inert gas flushing process, the transparent nanostructure punch being held at the top (structured side down) and the substrate at the bottom. The deformation of the nanostructure punch is controlled by the pressure or the force with which the deformation means are acting on the nanostructure punch. It is advantageous here to reduce the effective chucking area of the chucking apparatus with the nanostructure punch so that the nanostructure punch is only partially supported by the chucking apparatus, preferably is supported only on the edge. In this way the smaller contact area on the edge yields lower adhesion between the nanostructure punch and the punch mount or the punch chucking apparatus. This enables careful and reliable detachment of the nanostructure punch, with detachment forces which are as small as possible. The detachment of the nanostructure punch is thus controllable, especially by reducing the negative pressure on the chucking surface.

The nanoimprint process is preferably initiated with an actuator (pin), alternately in the substrate center M or substrate edge R. In doing so the UV-transparent nanostructure punch is locally bent with the actuator (deformation) in order to define the first contact point (partial area of the punch surface) with the liquid embossing resist on the substrate. After the first contact point has been reached, the pressure on the vacuum tracks of the punch chucking apparatus is interrupted, or especially separately for each vacuum track, reduced so that the punch is released and the embossing front can run independently over the entire punch surface. The vacuum tracks of the upper wafer chuck are preferably located in the edge region so that the detachment from the nanostructure punch is carried out in a controlled manner, especially by reducing the negative pressure on the chucking surface. Only by controlled reduction of the negative pressure is detachment of the nanostructure punch from the punch chucking apparatus, especially from the edge region, effected.

First, the transparent nanostructure punch is loaded especially on the top side wafer chuck (punch chucking apparatus) and detected with an alignment system. Afterward the resist-coated substrate is loaded and the two wafers are aligned with high precision with an alignment system for exact alignment. Patent DE102004007060 B3 describes a device and a method for joining two wafers, or any type of flat component which is to be aligned, along their corresponding surfaces. In doing so the wafers are exactly aligned. The device for nanoimprint embossing has similar features, here one substrate and one nanostructure punch at a time being exactly aligned: a) a first apparatus for chucking and aligning a nanostructure punch (punch chucking apparatus), b) a second apparatus for chucking and aligning a substrate relative to the nanostructure punch (substrate chucking apparatus).

The contact surfaces make contact and the corresponding surfaces are embossed by means of the apparatus at one embossing initiation site. The nanoimprint embossing of the substrate with the nanostructure punch takes place along one embossing front which runs from the embossing initiation site to the side edges of the nanostructure punch by detaching the nanostructure punch from the punch chucking surface.

According to one advantageous embodiment a detection apparatus (not shown) provides for exact alignment of the substrate and the nanostructure punch by its detecting the relative positions and relaying them to the control unit which then aligns the substrate and the nanostructure punch to one another. The alignment takes place manually or automatically (preferably) with a misalignment of less than 100 μm, preferably less than 10 μm, still more preferably less than 1 μm, most preferably less than 100 nm, most preferably of all less than 10 nm.

The distance between the substrate and the nanostructure punch is then reduced to an exactly defined distance before the nanoimprint process is started. In the embossing method of the present invention the substrate and the punch are not placed flat on one another, but are brought into contact with one another first at one point, for example the middle M of the substrate, by the nanostructure punch being pressed lightly against the substrate by deformation means and in doing so being deformed. After detaching the deformed, i.e. bent nanostructure punch (in the direction of the opposite substrate) a continuous and uniform embossing along the embossing front takes place by the advance of an embossing wave.

Inasmuch as the deformation means is at least one pressure element (actuator) which penetrates the chucking contour, the pressure can be applied uniformly, especially from the center Z outward. Preferably there is a mechanical approach especially by a pin or actuator. Other deformation means such as exposure to a fluid or a gas are conceivable.

In a first embodiment of the present invention the nanoimprint process is initiated with an actuator in the substrate center (middle M) and the embossing front propagates from the center, from inside to outside, toward the wafer edge. Here it is advantageous to allow the resulting force $F_a$ to act by triggering the actuator (pin) or the actuator apparatus in the center of mass of a contact surface between the substrate and nanostructure punch. Here the force $F_a$ is less than 100 kN, preferably less than 10 kN, more preferably less than 1 kN, most preferably less than 500 N, most preferably of all less than 100 N, still more preferably less than 10 N.

In a second embodiment of the present invention the nanoimprint process is initiated with an actuator on the substrate edge and the embossing front propagates away from the edge contact point R. In this embodiment the resulting force $F_a$ acts by triggering the actuator or actuator apparatus in the surface edge region of the nanostructure punch. By acting on the nanostructure punch on the edge of the chucking surface (on the back of the nano structure punch) especially careful detachment is possible.

In the two embodiments the embossing front runs at least largely independently over the entire punch surface, especially caused by the force of the nanostructure punch due to weight.

Then, in one preferred embodiment the wafer stack is transferred to an unloading station and the resist is cross-linked through the transparent punch by UV light. The embossing resist (curable material) is cured by the UV cross-linking. The UV light used is alternately broadband light or it is specially matched to the photoinitiator used in the embossing resist. The wavelength range of the curable material is especially between 50 nm and 1000 nm, preferably between 150 nm and 500 nm, more preferably between 200 nm and 450 nm.

At the end of the method the nanostructure punch in the embossing chamber is removed from the substrate and the substrate is unloaded.

In an installation of the present invention especially the process steps of coating of the substrate, alignment, embossing (nanoimprint lithography), separation of the punch and substrate, and optionally inspection (metrology) are integrated. It would be conceivable to carry out separation directly in the imprint stage, thus the punch remains in the installation, in contrast to wafer bonding installations according to AT405775B, for example. The installation preferably has sensors for force monitoring for control of the separation step. Furthermore in particular precautions are taken to avoid static charges. The method of the present invention for nanoimprint embossing of substrates with a hard polymer punch therefore in one general embodiment has especially the following steps:

a) substrate coating or resist application, therefore application of the structure material (resist) to the substrate by means of an application apparatus, for example a spin resist application installation, b) alignment of the substrate (chucking apparatus) and nanostructure punch (embossing apparatus) by means of an alignment apparatus, c) embossing of the substrate by the embossing apparatus with an actuator, d) UV exposure of the curable material and separation of the nanostructure punch and substrate.

The installation has especially one module group with a common working space which can be sealed if necessary relative to the ambient atmosphere. Here the modules, for example the resist application module (for spin coating, for example), imprint module and unloading module can be arranged in a cluster or star configuration around a central module with one movement apparatus (robot system). The separation can take place directly in the imprint stage. Likewise the resist can be applied separately from the embossing process in its own module; this yields major throughput advantages. For reduced embossing defects and easier separation between the punch and substrate the embossing can be carried out on the imprint stage in the imprint module in a vacuum and/or under inert gas. The embossing under an inert gas atmosphere can yield advantages such as better chemical resistance, better adhesion and faster UV hardening. Alternatively the entire working space can be filled with an inert gas and/or exposed via a vacuum apparatus to a vacuum as a defined atmosphere. The application process (coating of the substrate) can also be carried out in the above defined atmosphere. Thus gas inclusions which arise can be largely avoided or precluded.

One important advantage of this new technology is that resist-blanketed substrates can be contacted without defects at ambient pressure and under an inert gas atmosphere.

The embodiment of the installation of the present invention makes possible aligned embossing of high-resolution structures on the wafer plane with a sub 200 nm alignment accuracy especially with the aid of an alignment method for aligning two components, therefore the substrate and nanostructure punch.

The embodiment of the present invention in particular enables distortion-free and large-area embossing of high-resolution structures. One advantage of the method of the present invention is that resist-blanketed substrates at ambient pressure can be contacted free of defects under inert gas. Furthermore automation of the technology is possible so that resist application and embossing can be carried out quickly, uniformly, free of defects, and free of foreign particles.

Articles which can be produced with this method are among others hard disk drives (HDDs) of the next generation such as bit patterned media (BPM), polarizers, quantum dots, photonic structures, optical structures, as well as structures for sequencing (nanopores, nanodots, etc). The execution of the described methods for substrates with a hole (hard disk) will be mentioned in particular.

BRIEF DESCRIPTION OF THE DRAWINGS

Other advantages, features and details of the invention will become apparent from the following description of preferred exemplary embodiments and using the drawings.

FIG. 5b shows a cross sectional view of the device of the invention in a second method step of the invention, FIG. 5c shows a cross sectional view of the device of the invention in a third method step of the invention.

FIG. 7a shows a cross sectional view of the device of the invention in a second embodiment of the method of the invention with an actuator which is positioned centrally on the punch, FIG. 7b shows a cross sectional view of the device of the invention in a second embodiment of the method after the approach of the punch chuck and substrate chuck to one another, FIG. 7c shows a cross sectional view of the device of the invention in the second embodiment of the method during the contacting of the punch by an actuator, elastic bending of the nanostructure punch and contact-making between the nanostructure punch with the substrate with a hole taking place by the actuator, FIG. 7d shows a cross sectional view of the device of the invention in the second embodiment of the method during the advancing embossing wave between the punch and substrate with the hole, the nanostructure punch being detached from the punch chucking apparatus by interrupting the vacuum in the vacuum tracks, FIG. 7e shows a cross sectional view of the device of the invention in the second embodiment of the method with ended embossing front, FIG. 8 shows a cross sectional view of the substrate chucking apparatus after embossing, the wafer stack (substrate with resting nanostructure punch) being transferred to an unloading station and the curable material being cross-linked/cured in particular through the transparent punch by means of UV light, FIG. 9a shows a cross sectional view of one embodiment of the method of the invention, an actuator acting centrally on the nanostructure punch acting on the substrate and the nanostructure punch and FIG. 9b shows one embodiment of the method of the invention, an actuator acting at the edge of the substrate on the nanostructure punch acting on the substrate and the nanostructure punch.

In the figures the same components and components with the same function are identified with the same reference numbers.

DETAILED DESCRIPTION OF THE INVENTION

Figure 1A:
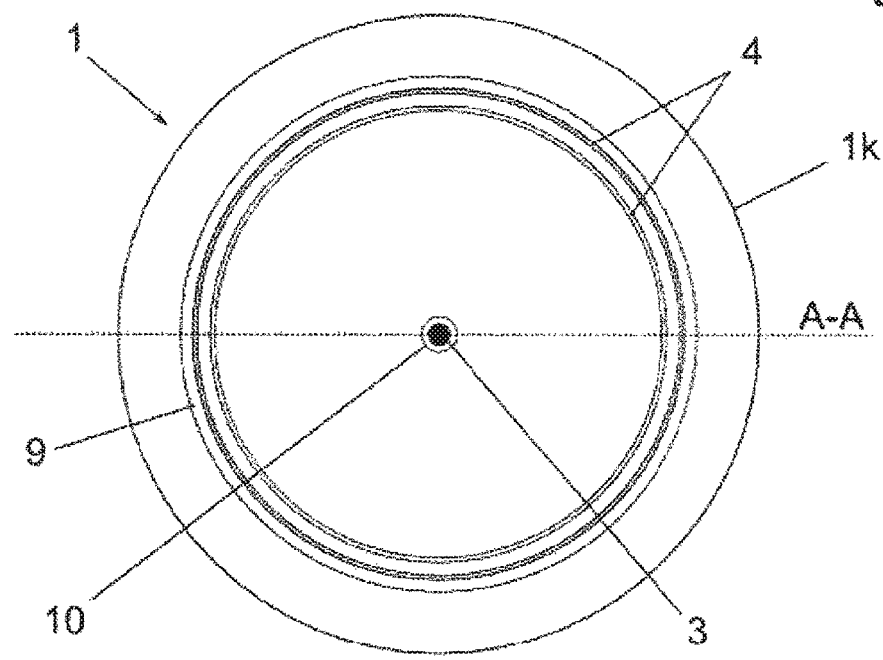
FIG. 1a shows a plan view of a punch chucking apparatus of one preferred embodiment of a device of the invention with a cutting line A-A.

FIG. 1a shows a punch chucking apparatus 1 of a device for chucking of a nanostructure punch 5 on a chucking body 1k. Nanostructure punch 5 is for embossing a nanostructure 13 that is formed on nanostructure punch 5. The chucking body 1k has a structure which in one chucking plane E has a chucking surface 1u. This can be easily recognized in the cross sectional view according to FIG. 1b. When the nanostructure punch 5 is chucked onto the punch chucking apparatus 1, only the chucking surface 1u comes into contact with one chucking side 5a of the nanostructure punch 5. Opposite the chucking side 5a is an embossing side 6 of the nanostructure punch 5.

The chucking surface 1u of the chucking apparatus 1 is matched in particular to the dimensions and peripheral contour of the nanostructure punch 5. The especially UV-transparent nanostructure punch 5 can have any shape, especially round, rectangular or square, preferably a standard wafer format.

The diameter of the nanostructure punch 5 preferably agrees largely with the diameter of a substrate 7 which is to be embossed or is chosen to be greater than the diameter of the substrates. Preferably the diameter of the nanostructure punch 5 is at least the same size as the diameter of the substrate 7, more preferably the diameter of the nanostructure punch 5 is larger by more than 5 mm, still more preferably the diameter of the nanostructure punch 5 is larger by more than 10 mm than the diameter of the substrate 7. The latter is preferably the case when the punch chucking apparatus 1 (nanostructure punch mount) is provided with vacuum tracks 4 outside an active embossing surface of the embossing side 6 in order to achieve uniform embossing on the substrate 7. Preferably the nanostructure punch 5 projects over the substrate 7 by a maximum 50 mm.

Figure 1B:
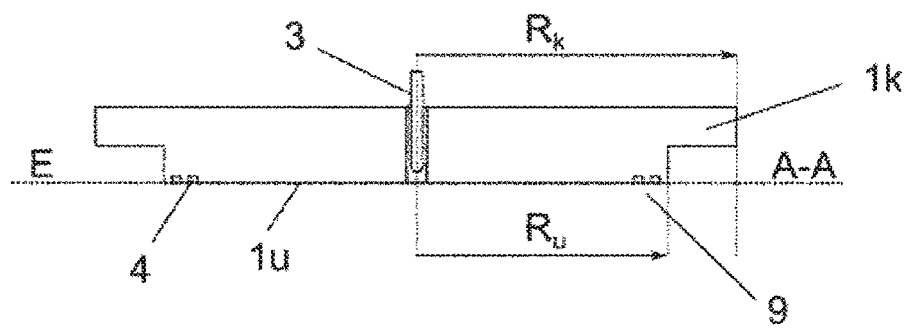
FIG. 1b shows a cross sectional view according to cutting line A-A from FIG. 1a, FIG. 1c shows a cross sectional view of a second embodiment of the invention.

The chucking surface 1u in the embodiment according to FIGS. 1a and 1b is circular and a radius $R_u$ of the chucking surface 1u corresponds roughly to the radius of the substrates 7 to be embossed. The size of the chucking surface 1u for the nanostructure punch 5 and of a chucking surface 2u for the substrate 7 is preferably chosen to be the same size or slightly larger than the diameter of the substrate 7 and/or of the nanostructure punch 5. The diameters of the substrates 7 correspond preferably to the diameters of 2", 4", 6", 8", 12" or 18" which are conventional in the semiconductor industry.

A radius $R_k$ of the chucking body 1k, as shown in the embodiment according to FIG. 1b, can be larger than the radius $R_u$ of the chucking surface 1u, especially by an annular shoulder section which is set back relative to the chucking surface 1u.

Preferably only one outer ring section 9 of the chucking surface 1u is intended for fixing of the nanostructure punch 5 by means of the vacuum tracks 4. The method of the invention is improved by the fixing of the nanostructure punch 5 taking place only in the region of the side edge of the chucking surface 1u. By reducing the negative pressure on the chucking surface 1u the detachment from the nanostructure punch 5 can be carried out in a controlled manner, especially from the ring section 9. The ring section 9 of the chucking surface 1u extends from the outside contour of the chucking surface 1u to the center of the chucking surface 1u, especially in a width from 0.1 mm to 50 mm, preferably in a width from 0.1 mm to 25 mm. The ring section 9 extends especially in a width from 1/100 to 1/5 of the punch diameter, preferably in a width of 1/50 to 1/10 of the punch diameter. In the exemplary embodiment according to FIG. 1a the negative pressure is applied by a vacuum apparatus (not shown) on two negative pressure channels or vacuum tracks 4 which run especially concentrically to one another.

In FIG. 1b the chucking surface 1u according to the first embodiment of the punch chucking apparatus 1 is made blanketing or even (aside from the vacuum tracks 4).

Figure 1C:
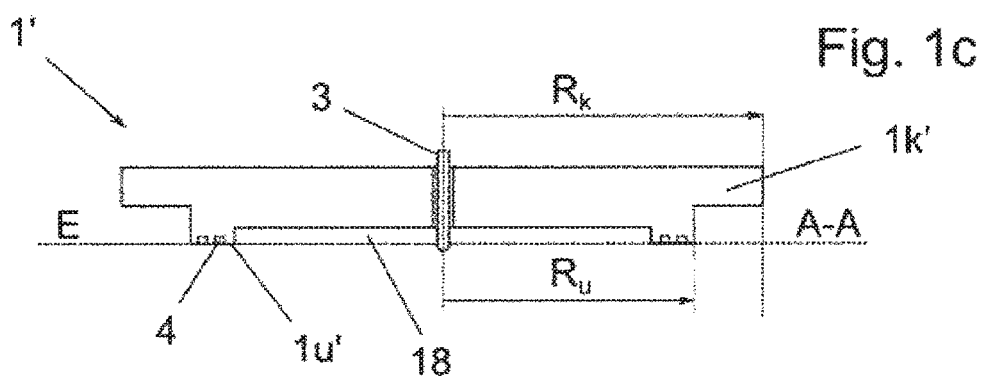

According to another embodiment (FIG. 1c) the chucking body 1k' of a second embodiment of the punch chucking apparatus 1' is set back relative to the chucking plane E, especially within a chucking surface 1u' so that at least one depression 18 is formed. In this way the support surface of the nanostructure punch 5, therefore the chucking surface 1u', is made smaller compared to the embodiment according to FIG. 1a. The support surface according to one alternative embodiment can be made smaller by honeycomb or circular depressions which are arranged concentrically to the center. The depth of the depression(s) 18 can correspond to the depth of the vacuum tracks 4 according to one advantageous embodiment.

The nanostructure punch 5 and optionally also other bordering components of the punch mount are preferably made of UV-transparent materials.

Figure 2A:
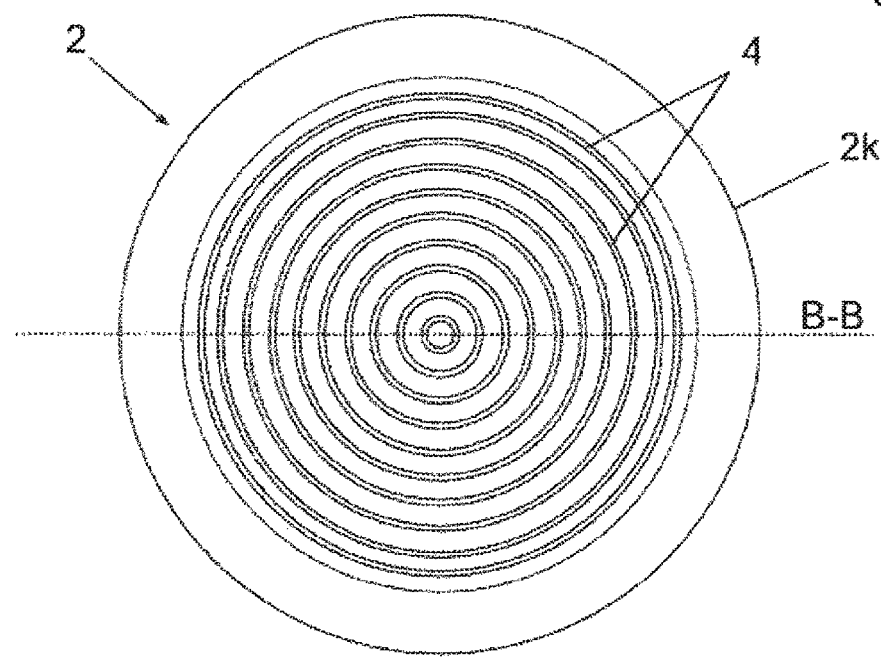
FIG. 2a shows a plan view of a substrate chucking apparatus of one preferred embodiment of a device of the invention with a cutting line B-B.

FIG. 2a shows a substrate chucking apparatus 2 of a device for chucking of the substrate 7 on a chucking body 2k. The chucking body 2k according to one advantageous embodiment of the invention can be coated. The chucking body 2k has the chucking surface 2u which can be aligned parallel to the chucking plane E (FIG. 2b).

The chucking surface 2u of the chucking apparatus 2 is preferably at least largely matched to the dimensions of the substrate. The chucking surface 2u of the chucking apparatus 2 in the embodiment according to FIGS. 2a and 2b is circular and the radius $R_u$ of the chucking surface 2u corresponds at least largely to the radius of the substrates 7. The diameters of the substrates 7 correspond preferably to the diameters of 2", 4", 6", 8", 12" or 18", preferably 18" or larger, which are conventional in the semiconductor industry.

Figure 2B:
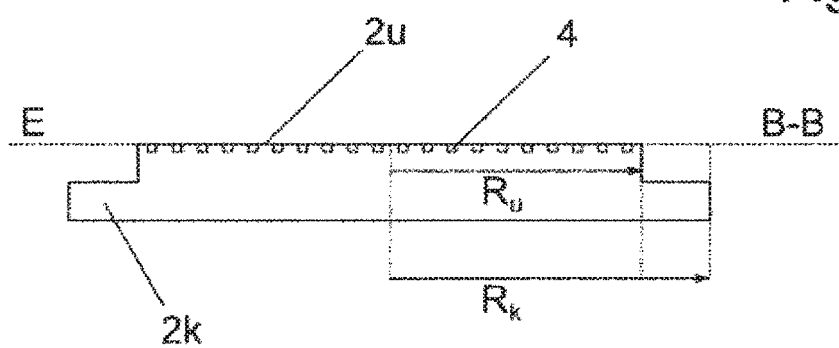
FIG. 2b shows a cross sectional view according to cutting line B-B from FIG. 2a, FIG. 2c shows a cross sectional view of a second embodiment of the invention, especially for bilaterally structured product substrates.

A radius $R_k$ of the chucking body 2k according to FIG. 2b can be larger than the radius $R_u$ of the chucking surface 2u. In the embodiment according to FIG. 2b the entire chucking surface 2u is intended for fixing of the substrate 7 by means of vacuum tracks 4. In the exemplary embodiment according to FIG. 2a the negative pressure for fixing of the substrate 7 is applied by a vacuum apparatus (not shown) on several negative pressure channels or vacuum tracks 4 which cover the chucking surface 2u and which run concentrically to one another.

Figure 2C:
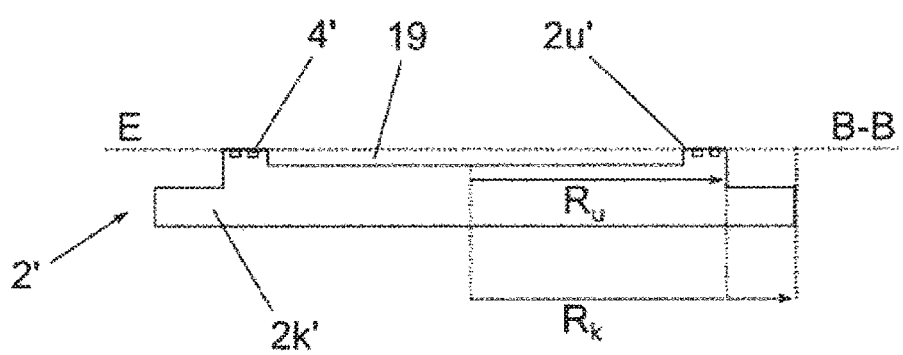

In FIG. 2c the chucking surface 2u' according to a second embodiment of the chucking body 2k' is not made blanketing, but there is a depression 19 which is set back relative to the chucking surface 2u', surrounded, preferably enclosed in particular by the chucking surface 2u'. This depression changes the support surface of the substrate 7 such that in particular bilaterally structured or bilaterally processes substrates 7 can be used. The support surface according to one alternative embodiment can be made smaller by honeycomb or circular depression(s) 19 which are arranged concentrically to the center. The depth of the depression(s) 19 can correspond to the depth of the vacuum tracks 4' according to one advantageous embodiment.

Figure 3A:
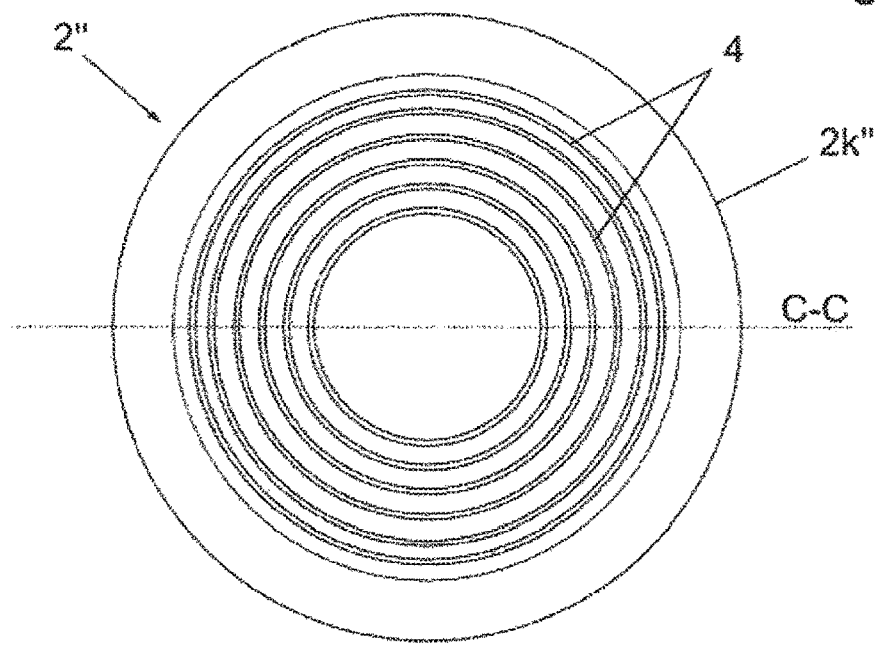
FIG. 3a shows a plan view of a substrate chucking apparatus of a second embodiment of a device of the invention with a cutting line C-C.

FIG. 3a shows a substrate chucking apparatus 2" of a device for chucking an annular substrate 7' (see FIG. 3c) on a chucking body 2k" according to a third embodiment for a substrate 7' with a hole 20 in the center of the substrate 7'. For example a hard disk is possible as the substrate 7' with a hole 20. A chucking surface 2u" of the chucking apparatus 2" is matched to the dimensions of the substrate 7". The chucking surface 2u" of the chucking apparatus 2" in the embodiment according to FIGS. 3a and 3b is circular and a radius $R_u$ of the chucking surface $2u''$ corresponds largely to the radius of the substrates $7'$.

Figure 3B:
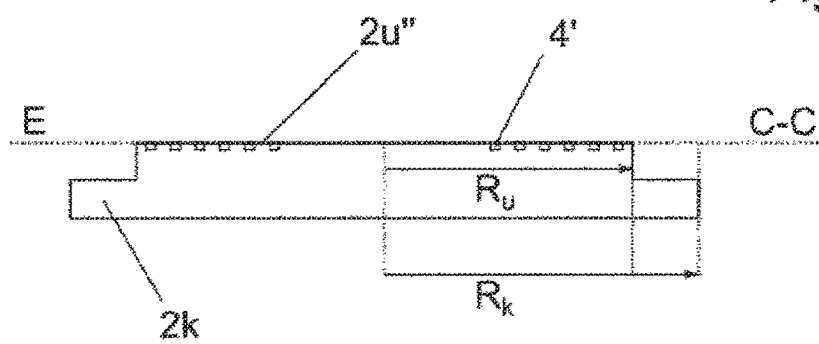
FIG. 3b shows a cross sectional view according to cutting line C-C from FIG. 3a, FIG. 3c shows a plan view of a substrate with a hole, especially for producing a hard disk.

According to FIG. 3b only one outer ring section of the chucking surface $2u''$ covering roughly half the radius $R_u$ is intended for fixing of the substrate $7'$ by means of the vacuum tracks $4'$. The substrate $7'$ is thus fixed by a vacuum apparatus (not shown) by negative pressure on several negative pressure channels or vacuum tracks $4'$ which run concentrically to one another and which correspond to the entire annular substrate surface.

Figure 3C:
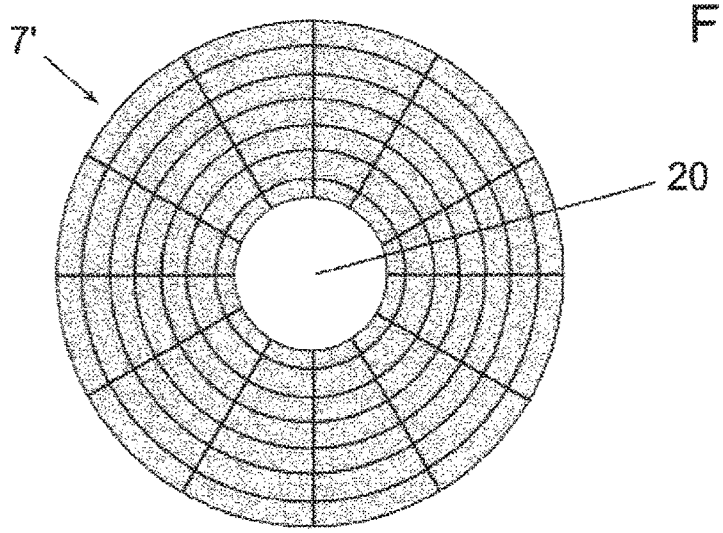
Figure 4A:
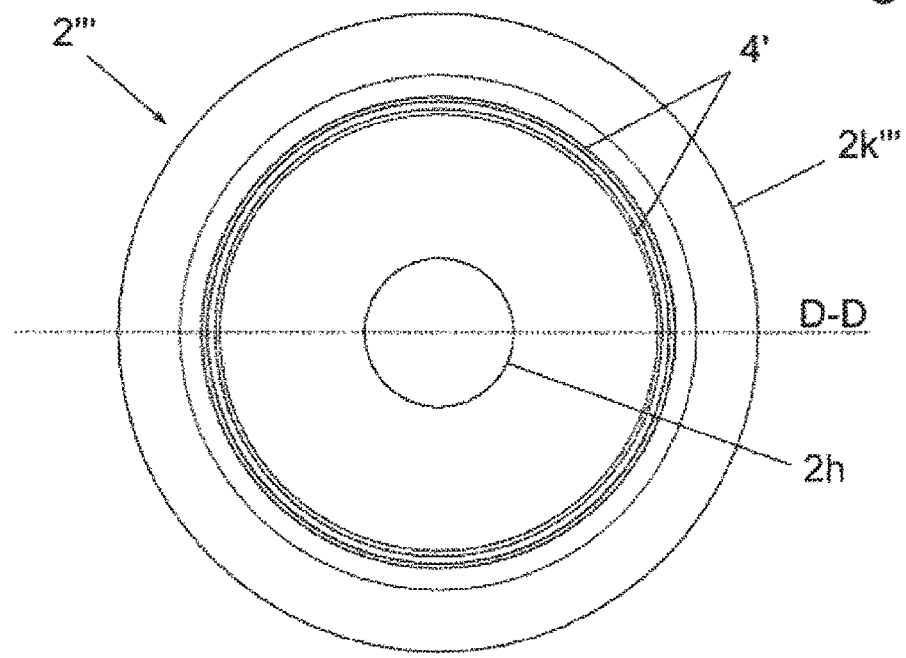
FIG. 4a shows a plan view of a substrate chucking apparatus of a third embodiment of a device of the invention with a cutting line D-D.

FIG. 4a shows another substrate chucking apparatus $2'''$ of a device for chucking of the substrate $7'$ on a chucking body $2k'''$ according to a fourth embodiment for the substrate $7'$ with a hole 20 (FIG. 3c).

One chucking surface $2u'''$ for fixing of the substrate $7'$ contains a core $2h$ which projects relative to the chucking surface $2u'''$ and which corresponds especially to the hole 20. The core $2h$ of the substrate chucking apparatus $2'''$ for substrates 7 can have different shapes, such as for example round, cruciform, star-shaped, oval or angular. The height of the core $2h$ corresponds especially to the thickness of the substrates $7'$. The average thickness of the substrates $7'$ is especially between 20 and 10000 µm, preferably between 100 and 2000 µm, more preferably between 250 and 1000 µm. The chucking surface $2u'''$ and the core $2h$ can have other dimensions so that other media can also be fixed.

Figure 4B:
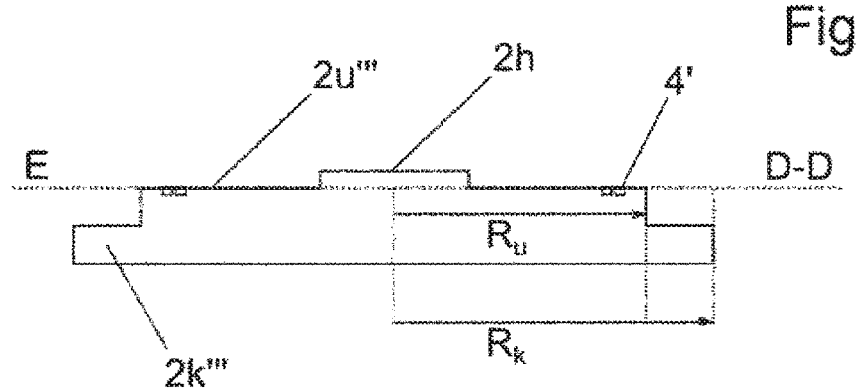
FIG. 4b shows a cross sectional view according to cutting line D-D from FIG. 4a, FIG. 5a shows a cross sectional view of the device of the invention in a first method step of the invention.

The chucking surface $2u'''$ of the chucking apparatus $2'''$ in the embodiment according to FIGS. 4a and 4b is circular and a radius $R_u$ of the chucking surface $2u'''$ corresponds largely to the radius of the substrates 7. In the embodiment according to FIG. 4b only one outer ring section of the chucking surface $2u'''$ is intended for fixing of the substrate $7'$ by means of vacuum tracks 4. In the exemplary embodiment according to FIG. 4b the substrate $7'$ with the hole 20 is thus fixed by a vacuum apparatus (not shown) by negative pressure on two negative pressure channels or vacuum tracks 4 which run concentrically to one another and which cover the chucking surface $2u$ on the outer ring section.

FIG. 5a shows the chucking apparatus 1 (embodiment according to FIG. 1a) and 2 (embodiment according to FIG. 2a) (also called chucks in the semiconductor industry) of a device for chucking of the nanostructure punch 5 and the substrate 7. The chucking apparatus 1 contains a central opening 10 for routing of an actuator 3 (see also FIG. 1a) or an actuator apparatus (not shown).

In a first embodiment of the invention the embossing process (nanoimprint process) is initiated with the actuator 3 in the center of the substrate. The actuator 3 can have different shapes and executions. Instead of an actuator pin, alternatively pressurization with a fluid or a gas as the actuator 3 is conceivable. The opening 10 for the actuator 3 according to FIG. 1 can have different shapes and sizes.

FIG. 5b shows the device with the especially UV-transparent nanostructure punch 5 loaded onto the punch chucking apparatus 1. The fixing of the nanostructure punch 5 (having nanostructure 13 formed thereon) takes place by a vacuum or negative pressure via the vacuum tracks 4 in the outer ring section of the punch chucking apparatus 1.

In the next process step according to FIG. 5c the substrate 7 is loaded onto the substrate chucking apparatus 2 and fixed by a vacuum or negative pressure via the vacuum tracks $4'$, a curable material 8 which has been applied to the substrate 7 with a punch surface 14 pointing up, therefore in the direction of the nanostructure punch 5. The substrate 7 and the nanostructure punch 5 are kept separate during the evacuation and/or inert gas flushing process (therefore not yet in contact), the nanostructure punch 5 being arranged and aligned at the top with the embossing side 6 down and the substrate 7 at the bottom with the curable material 8 up.

Figure 6A:
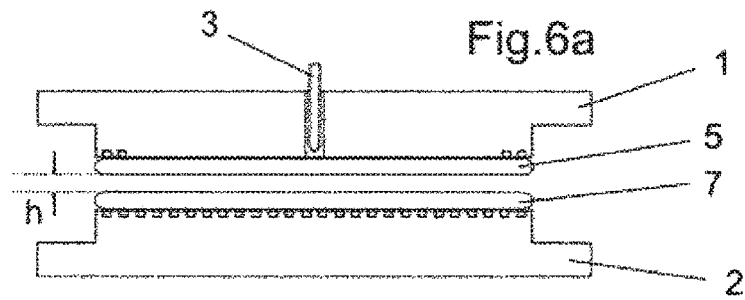
FIG. 6a shows a cross sectional view of the device of the invention in a fourth method step of the invention.

FIGS. 6a to 6e show the process steps in a first embodiment of the device and of the method of the invention for a large-area nanoimprint process with a hard, UV-transparent nanostructure punch 5. The substrate 7 and the nanostructure punch 5 are first aligned with high precision for an exact alignment and are kept separate during the evacuation and/or inert gas flushing process (FIG. 6a).

Figure 6B:
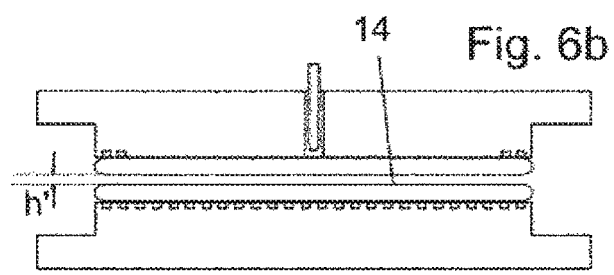
FIG. 6b shows a cross sectional view of the device of the invention in a fifth method step of the invention after the punch chuck and substrate chuck approach one another.

As shown in FIG. 6b, a distance h between the substrate 7 and nanostructure punch 5 is reduced to an exactly defined distance h' before the nanoimprint process is started. Here the distance h' is especially less than 500 µm, preferably less than 250 µm, most preferably less than 100 µm, most preferably of all less than 50 µm.

Figure 6C:
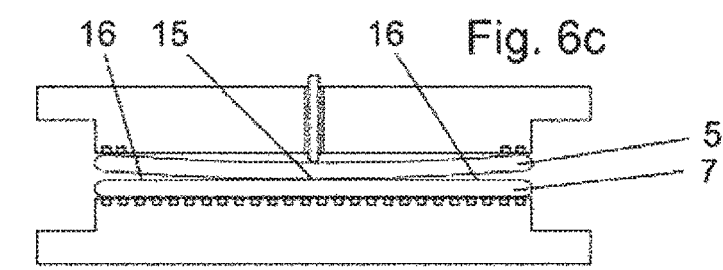
FIG. 6c shows a cross sectional view of the device of the invention in a sixth method step of the invention, in particular during the contacting of a nanostructure punch by an actuator for elastic bending of the nanostructure punch and contacting of the nanostructure punch with the substrate.
Figure 6D:
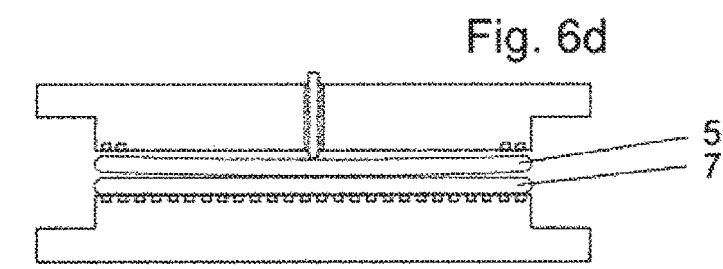
FIG. 6d shows a cross sectional view of the device of the invention in a seventh method step of the invention, during an advancing embossing wave along an embossing front between the punch and substrate, the nanostructure punch being detached from a punch chucking apparatus by interrupting the vacuum in the vacuum tracks.

By means of the actuator 3 the nanostructure punch 5 and the substrate 7 make contact on a partial area 15 as much as possible in spots. The contact-making which is shown in FIG. 6c takes place by a concentric deformation of the nanostructure punch 5 by the pressure which has been applied via the actuator 3, especially in the middle of the nanostructure punch 5. Here it is advantageous to apply a resulting force $F_a$ by triggering the actuator 3 or the actuator apparatus (not shown) in the center of mass of the surface of the nanostructure punch 5 and thus in the center of mass of a contact surface between the substrate 7 and nanostructure punch 5.

After the first contact point has been reached, controlled reduction of the negative pressure causes release of the nanostructure punch 5 from the punch chucking apparatus 1, after which an embossing front 12 propagates from the center especially concentrically, to the edge of the substrate 7 or the punch surface 14. The prestress which has been applied by means of deformation of the nanostructure punch 5 causes contact of the nanostructure punch 5 with the substrate 7 proceeding from the middle of the nanostructure punch 5 radially to the outside as far as the periphery (see also FIG. 9a). The remaining area 16 of the punch surface 14 makes contact by the release.

Figure 6E:
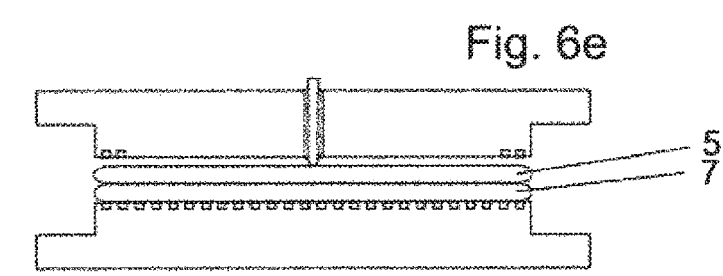
FIG. 6e shows a cross sectional view of the device of the invention in an eighth method step of the invention with ended embossing front.

FIG. 6e shows a completed embossing in which the embossing front 12 has reached the edge of the substrate 7. The substrate 7 and the nanostructure punch 5 are in contact roughly over the entire area. Then the curing according to FIG. 8 can take place (see below).

FIGS. 7a to 7e show the process steps in a second embodiment of the device and of the method of the invention for large-area nanoimprint process with a hard, UV-transparent nanostructure punch 5. The substrate 7 in this exemplary embodiment is the substrate $7'$ according to FIG. 3c.

The substrate $7'$ preferably has a diameter of 2.5 inches or 3.5 inches. The punch $7'$ has a diameter of 4 inches or greater and is thus larger than the substrate $7'$. The chucking surface $1u$ is formed in an outer ring section of the chucking body $1k$ for fixing of the nanostructure punch 5 by means of vacuum tracks 4 (see FIG. 1b). Thus the vacuum tracks 4 of the chucking surface $1u$ are outside the active punch surface 14 of the nanostructure punch 5. Since the substrate $7'$ with the hole 20 has a smaller diameter than the nanostructure punch 5, the vacuum tracks 4 for holding the nanostructure punch 5 are outside of the punch surface 14 which is to be embossed. The size difference is used to fix the nanostructure punch 5 by means of the vacuum tracks 4.

As FIG. 7b shows, the distance h between the substrate 7 and the nanostructure punch 5 is reduced to an exactly defined distance h' before the nanoimprint process is started. Here the distance h' is especially less than 500 µm, preferably less than 250 µm, most preferably less than 100 µm, most preferably of all less than 50 µm.

The contact-making which is shown in FIG. 7c takes place by concentric deformation of the nanostructure punch 5 by the pressure which has been applied via the actuator 3 in the middle of the nanostructure punch 5. Here it is advantageous to apply a resulting force $F_a$ by triggering the actuator 3 or the actuator apparatus (not shown) in the center of mass of the surface of the nanostructure punch 5 and thus in the center of mass of a contact surface between the substrate 7' and nanostructure punch 5.

Due to the center hole 20 of the substrate 7' the contact surface is an annular partial area 15' of the punch surface 14, the embossing front 12 beginning at the edge of the hole 20.

After the annular contact-making has taken place, controlled reduction of the negative pressure of the vacuum tracks 4 causes release of the nanostructure punch 5 from the punch chucking apparatus 1. The prestress which has been applied by means of deformation of the nanostructure punch 5 causes contact of the nanostructure punch 5 with the substrate 7' proceeding from the middle of the nanostructure punch 5 radially to the outside as far as the periphery of the substrate 7' (see also FIG. 9a). The remaining area 16' of the punch surface 14 makes contact by the release.

As soon as the nanostructure punch 5 has made contact with the edge of the hole 20, the embossing front 12 propagates concentrically toward the outer edge of the substrate. FIG. 7e shows a completed embossing front 12. The substrate 7' and the nanostructure punch 5, except for the hole 20, are therefore in blanket contact on the entire punch surface 14.

FIG. 8 shows the wafer stack or substrate-punch stack at an unloading station and direct cross-linking of the curable material 8, especially a photoresist, by means of UV light 11. More generally the curing can be carried out by electromagnetic radiation, by heat, by current, by magnetic fields or other methods. Preferably the curing takes place through the transparent nanostructure punch 5. In another embodiment the curing is carried out still in the imprint stage. Here curing takes place through the transparent punch chucking apparatus 1, 1' and through the transparent nanostructure punch 5.

Curing and separation of the nanostructure punch 5 from the substrate 7, 7' can take place directly in the imprint stage. Preferably the installation with the device of the invention has one module group with a common working space which can be sealed if necessary relative to the ambient atmosphere. Here the modules, for example the resist application module, imprint module and unloading module can be arranged in a cluster or star configuration around a central module with one movement apparatus (robot system).

The method enables high-resolution structuring in the sub-micron range, preferably below 100 nm, more preferably below 50 nm, most preferably below 10 nm.

One alternative embodiment is shown in FIG. 9b. Here the nanoimprint process is initiated with an actuator 3, off-center, especially on the substrate edge, and the embossing front 12 propagates circularly from the contact point.

The propagation direction(s) of the embossing fronts 12 according to the first and second embodiments are compared schematically in FIGS. 9a and 9b. Examples of the position of the actuators 3 are shown in FIGS. 9a and 9b.

REFERENCE NUMBER LIST 1, 1' punch chucking apparatus
1k, 1k' chucking body
1u, 1u' chucking surface
2, 2', 2", 2'" substrate chucking apparatus
2u, 2u', 2u", 2u'" chucking surface
2k, 2k', 2k", 2k'" chucking body
2h core
3 actuator (pin)
4 vacuum tracks
4' vacuum tracks
5 nanostructure punch
5a chucking side
6 embossing side
7, 7' substrate
8 curable material
9 ring section
10 opening
11 UV light
12 embossing front direction
13 nanostructure
14, 14' punch surface
15, 15' partial area
16, 16' remaining area
17 embossing apparatus (especially consisting of punch chucking apparatus and nanostructure punch)
18 depression
19 depression
20 hole
A-A, B-B, C-C, D-D cutting line
E chucking plane
$R_u$ ring radius
$R_k$ radius of the chucking body
$F_a$ force Having described the invention, the following is claimed:

1. A device for embossing a nanostructure that is formed on a nanostructure punch into a punch surface of a curable material that has been applied to a substrate, the nanostructure being aligned relative to the punch surface, said device comprising:
   the nanostructure punch;
   a punch chucking apparatus configured to hold and move the nanostructure punch, the punch chucking apparatus having fixing means, the fixing means being configured to hold the nanostructure punch to the punch chucking apparatus; and
   an actuator controlled to deform the nanostructure punch by applying pressure to a backside of the nanostructure punch to prestress the nanostructure punch and place a partial area of the nanostructure punch in contact with a corresponding partial area of the punch surface,
   wherein, when the contact between the partial area is established, the fixing means is configured to remove a peripheral edge of the nanostructure punch therefrom to place a remaining area of the nanostructure punch in contact with a corresponding remaining area of the punch surface.

2. The device as claimed in claim 1, wherein the nanostructure punch is formed at least predominantly from at least one of the following UV-transparent materials:
   quartz, and/or
   silicon dioxide, and/or
   a polymer.

3. The device as claimed in claim 1, wherein an optical transparency of the nanostructure punch is greater than 0%.

4. The device as claimed in claim 1, further comprising:
   a substrate chucking apparatus configured to hold and move the substrate.

5. The device as claimed in claim 1, further comprising:
   a curing means configured to cure said curable material after the partial area and the remaining area of the nanostructure punch are in respective contact with the corresponding partial area and the corresponding remaining area of the punch surface.

6. The device as claimed in claim 5, wherein the curing means is at least one means selected from the group consisting of UV light, electromagnetic radiation, heat, current, and magnetic fields.

7. The device as claimed in claim 2, wherein the polymer is at least one substance selected from the group consisting of polydimethylsiloxane, polytetrafluoroethylene, perfluorinated polyether, polyvinyl alcohol, polyvinyl chloride, and ethylene tetrafluoroethylene.

8. The device as claimed in claim 3, wherein the optical transparency of the nanostructure punch is greater than 20%.

9. The device as claimed in claim 1, wherein the punch chucking apparatus is further configured to move the nanostructure punch to a predetermined distance from the substrate before the partial area of the nanostructure punch is placed in contact with the corresponding partial area of the punch surface.

10. The device as claimed in claim 4, wherein the actuator acts orthogonally to the substrate chucking apparatus and a surface of the nanostructure punch.

11. The device as claimed in claim 1, wherein the actuator is further controlled to locally bend the nanostructure punch in order to define a first contact point with the curable material on the substrate, and
wherein the partial area of the punch surface is comprised of the first contact point.

12. The device as claimed in claim 11, further comprising:
an embossing front configured to run independently over the punch surface,
wherein, when the partial area of the nanostructure punch is in contact with the corresponding partial area of the substrate, the fixing means removes the peripheral edge of the nanostructure punch therefrom and the embossing front runs independently over the punch surface.

13. A method for embossing a nanostructure that is formed on a nanostructure punch into a punch surface of a curable material that has been applied to a substrate, the method comprising:
aligning the nanostructure relative to the punch surface;
holding and moving the nanostructure punch by means of a punch chucking apparatus, the holding comprising applying a fixing means of the punch chucking apparatus to the nanostructure punch to hold the nanostructure punch to the punch chucking apparatus;
deforming the nanostructure punch by applying pressure from an actuator to a backside of the nanostructure punch to prestress the nanostructure punch and place a partial area of the nanostructure punch in contact with a corresponding partial area of the punch surface; and
removing a peripheral edge of the nanostructure punch from the fixing means to place a remaining area of the nanostructure punch in contact with a corresponding remaining area of the punch surface.

14. The method as claimed in claim 13, wherein the nanostructure punch is formed at least predominantly from at least one of the following UV-transparent materials:
quartz, and/or
silicon dioxide, and/or
a polymer.

15. The method as claimed in claim 13, wherein an optical transparency of the nanostructure punch is greater than 0%.

16. The method as claimed in claim 13, further comprising:
curing said curable material after the deforming of the nanostructure punch and the removing of the peripheral edge of the nanostructure punch.

17. The method as claimed in claim 14, wherein the polymer is at least one substance selected from the group consisting of polydimethylsiloxane, polytetrafluoroethylene, perfluorinated polyether, polyvinyl alcohol, polyvinyl chloride, and ethylene tetrafluoroethylene.

18. The method as claimed in claim 15, wherein the optical transparency of the nanostructure punch is greater than 20%.

19. The method as claimed in claim 13, wherein the punch chucking apparatus moves the nanostructure punch to a predetermined distance from the substrate before the partial area of the nanostructure punch is placed in contact with the corresponding partial area of the punch surface.

20. The method as claimed in claim 13, further comprising:
controlling the actuator to locally bend the nanostructure punch in order to define a first contact point with the curable material on the substrate, and
wherein the partial area of the punch surface is comprised of the first contact point.

* * * * *